(12) United States Patent
Nishimura et al.

(10) Patent No.: US 6,859,116 B2
(45) Date of Patent: Feb. 22, 2005

(54) PIEZOELECTRIC RESONATOR (75) Inventors: Michiaki Nishimura, Kokubu (JP);
Fumio Fujisaki, Kokubu (JP);
Hirotaka Tsuyoshi, Kokubu (JP)

(73) Assignee: Kyocera Corporation, Kyoto (JP)

( * ) Notice: Subject to any disclaimer, the term of this patent is extended or adjusted under 35 U.S.C. 154(b) by 3 days.

(21) Appl. No.: 10/209,526

(22) Filed: Jul. 30, 2002

(65) Prior Publication Data

US 2003/0020564 A1 Jan. 30, 2003

(30) Foreign Application Priority Data

| Jul. 30, 2001 | (JP) | ......................................... | 2001-229694 |
| Jan. 29, 2002 | (JP) | ......................................... | 2001-020157 |
| Jan. 29, 2002 | (JP) | ......................................... | 2002-020158 |
| Jan. 29, 2002 | (JP) | ......................................... | 2002-020159 |
| Jan. 29, 2002 | (JP) | ......................................... | 2002-020160 |

(51) Int. Cl.[7] .................................................. H03H 9/00
(52) U.S. Cl. ........................ 333/187; 333/188; 333/189; 333/190; 333/191; 310/367
(58) Field of Search .............................. 333/187–191; 310/367

(56) References Cited

U.S. PATENT DOCUMENTS

| 3,838,366 | A | * | 9/1974 | Coussot | ....................... 333/192 |
| 4,017,753 | A | * | 4/1977 | Ishiwata et al. | ............ 310/368 |
| 4,124,809 | A | * | 11/1978 | Engdahl et al. | ............. 310/361 |
| 4,167,686 | A | * | 9/1979 | Fukuyo | ...................... 310/361 |
| 4,267,479 | A | * | 5/1981 | Kato | ........................... 310/348 |
| 4,625,138 | A | * | 11/1986 | Ballato | ...................... 310/320 |
| 4,754,187 | A | * | 6/1988 | Kosinski | ..................... 310/361 |
| 5,149,197 | A | * | 9/1992 | Rokos et al. | ............... 374/117 |
| 6,362,561 | B1 | * | 3/2002 | Kuroda et al. | ............. 310/368 |

FOREIGN PATENT DOCUMENTS

| JP | 363120508 A | * | 5/1998 | ................. 333/187 |

* cited by examiner

Primary Examiner—Michael Tokar
Assistant Examiner—Khai M. Nguyen
(74) Attorney, Agent, or Firm—Hogan & Hartson LLP

(57) ABSTRACT

A piezoelectric resonator comprising a piezoelectric substrate having a tapered portion as viewed from the side thereof, and drive electrodes provided on both opposing tapered surfaces of said tapered portion. The piezoelectric resonator corrects the dispersion in the thickness of the piezoelectric substrate relying upon the positions where the drive electrodes are formed, and makes it easy to finely adjust he frequency for compensating the dispersion in the thickness.

17 Claims, 9 Drawing Sheets

PIEZOELECTRIC RESONATOR

BACKGROUND OF THE INVENTION

1. Field of the Invention

The present invention relates to a piezoelectric resonator and, more particularly, to a piezoelectric resonator for high frequencies (100 to 300 MHz) based on a thickness extensional oscillation mode or a thickness shear oscillation mode.

2. Description of the Prior Art

In general, a piezoelectric resonator for high frequencies which relies upon a thickness extensional oscillation mode or a thickness shear oscillation mode, realizes resonance by using fundamental waves by decreasing the thickness of the piezoelectric substrate or by using third harmonics without decreasing the thickness of the piezoelectric substrate.

When the fundamental waves are used, the piezoelectric resonator must have a piezoelectric substrate of which the thickness is precisely decreased. When harmonics are used, the piezoelectric resonator must be so designed as to increase a peak valley value (P/V value) of the tertiary mode while suppressing the fundamental waves. In either case, dispersion in the thickness of the drive electrode must be decreased to be as small as possible since high frequencies are used.

When fundamental waves having such high frequencies as 100 to 300 MHz are used, the piezoelectric substrate must have such a small thickness that it becomes difficult to fabricate a piezoelectric resonator. The resonance frequency of a piezoelectric resonator using the thickness extensional oscillation or the thickness shear oscillation, varies in reverse proportion to the thickness of the piezoelectric substrate. In the case of a fundamental mode and when the piezoelectric substrate is made of a general piezoelectric material, the thickness must be decreased down to several tens of microns or smaller. To suppress the dispersion in the resonance frequency to be smaller than 1%, further, the dispersion in the thickness of the piezoelectric substrate must be suppressed to be not larger than 1%. Besides, the resonance frequency is more seriously affected by the dispersion in the thickness of the drive electrode as the thickness of the piezoelectric substrate decreases.

As described above, an increase in the resonance frequency makes it difficult to fabricate the piezoelectric resonator. When a piezoelectric resonator of a high resonance frequency is to be fabricated, therefore, it is a generally accepted practice to use a harmonic mode such as of the third harmonics.

In an ordinary design, in general, the piezoelectric resonator is more strongly excited with the fundamental waves than with the harmonic waves. To correctly excite the piezoelectric resonator with harmonics, therefore, it is required to increase the impedance peak of harmonics to be greater than that of the fundamental oscillation. It is therefore desired to so design the resonator as to suppress the fundamental mode and to develop third harmonics which are as neat as possible. As the frequency becomes high, however, the absolute value of P/V value of the tertiary mode decreases systematically and, besides, it becomes difficult to decrease the oscillation in the fundamental mode.

Figure 15A:
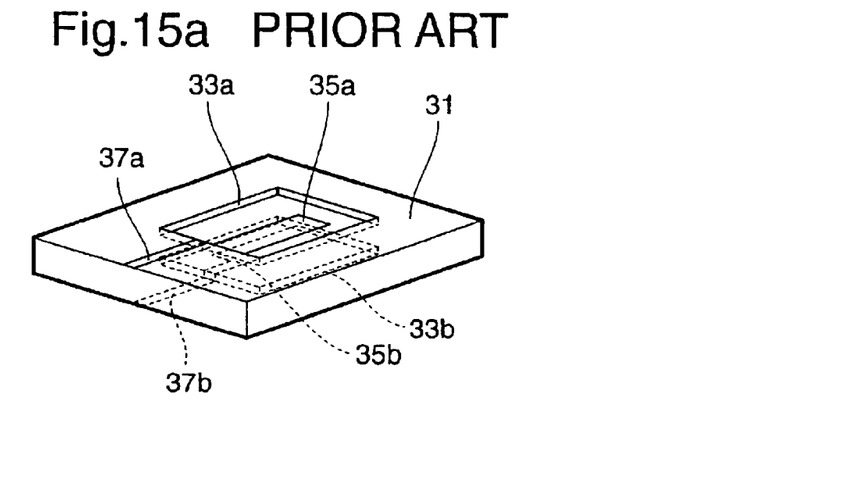
FIG. 15a is a perspective view thereof.
Figure 15B:
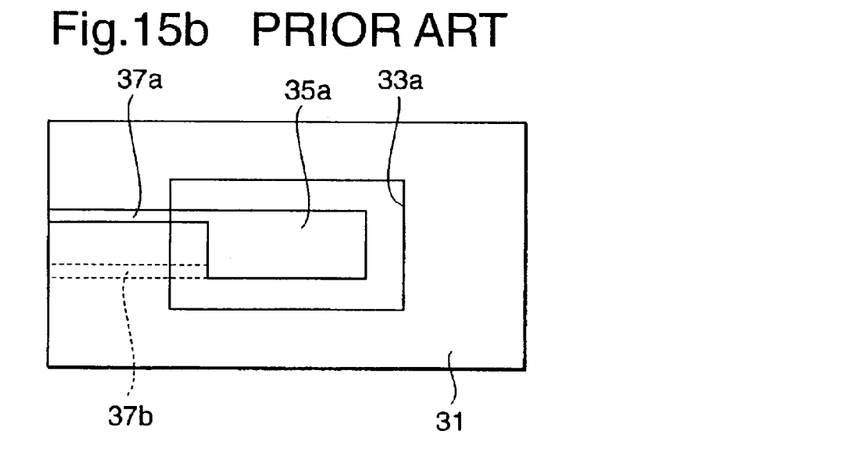
FIG. 15b is a plan view thereof and FIG. 15c is a side view thereof.
Figure 15C:
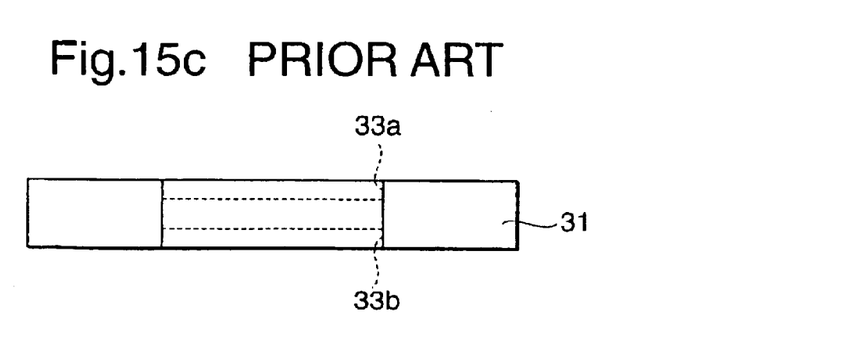

In order to solve the above problems, Japanese Unexamined Patent Publication (Kokai) No. 341064/2000 and Japanese Unexamined Patent Publication (Kokai) No. 205076/1999 propose quarts oscillators utilizing a fundamental wave mode in which the base portion of the resonator is formed thick and the oscillation portion is formed thin. FIGS. 15a to 15c illustrate the above piezoelectric resonator in which dents 33a and 33b are formed in both surfaces at the central portions of a square piezoelectric substrate 31 at positions facing each other, a pair of opposing drive electrodes 35a and 35b are formed in the dents 33a and 33b, and electrode wires 37a and 37b are connected to these drive electrodes 35a and 35b.

This piezoelectric resonator is suppressed from being broken since the piezoelectric substrate 31 is surrounded by a thick outer peripheral portion, but is accompanied by a problem in that it is very difficult to control the thickness of the piezoelectric substrate 31 of a portion where the drive electrodes 35a and 35b are formed maintaining good precision without dispersion. It is further necessary to highly precisely adjust the thickness of the drive electrodes 33a and 33b. The piezoelectric resonator of this structure must be precisely machined relying upon the etching technology inevitably driving up the cost of producing the devices.

SUMMARY OF THE INVENTION

It is therefore an object of the present invention to provide a piezoelectric resonator which makes it easy to obtain good characteristics even when the piezoelectric substrate on which the driving electrodes are formed has a dispersion in the thickness thereof.

According to the present invention, there is provided a piezoelectric resonator comprising a piezoelectric substrate having a tapered portion as viewed from the side thereof, and drive electrodes formed on both opposing tapered surfaces of the tapered portion.

According to the present invention, there is further provided a method of producing a piezoelectric resonator by forming a piezoelectric substrate having a tapered portion of which the thickness gradually decreases toward an end thereof, forming a conductor for drive electrodes on both opposing tapered surfaces of the tapered portion at an end thereof, and grinding the end of the tapered portion together with the conductor for drive electrodes to form drive electrodes on both tapered surfaces of the tapered portion.

In the piezoelectric resonator of the present invention, (i) when the length of the tapered portion in the horizontal direction is denoted by L, the thickness of the thinnest portion of the tapered portion is denoted by t1 and the thickness of the thickest portion of the tapered portion is denoted by t2, the tapered portion satisfies the conditions of the following formulas (1) and (2):

$$t1/t2 \geq 0.8 \tag{1}$$

$$(t2-t1)/L \leq 2/100 \tag{2}$$

(ii) the thickness of the drive electrodes gradually increases toward the thinnest portion of the tapered portion; and
(iii) electrode wires are connected to the drive electrodes and are extending toward the thickest portion of the tapered portion.

BRIEF DESCRIPTION OF THE DRAWINGS

FIGS. 1a and 1b are views illustrating a representative example of the piezoelectric resonator of the present invention, wherein

FIGS. 2a and 2b are diagrams illustrating simulated results of impedance characteristics of the piezoelectric resonator of the present invention, wherein

FIGS. 15a to 15c are views illustrating a conventional high-frequency quartz oscillator using a fundamental oscillation mode of not lower than 100 MHz, wherein

DETAILED DESCRIPTION OF THE INVENTION

Figure 1A:
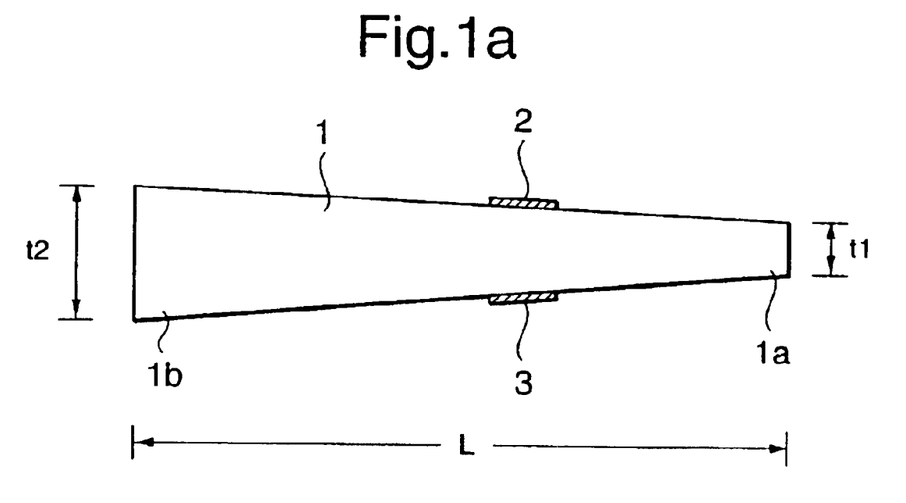
FIG. 1a is a side sectional view and FIG. 1b is a plan view.
Figure 1B:
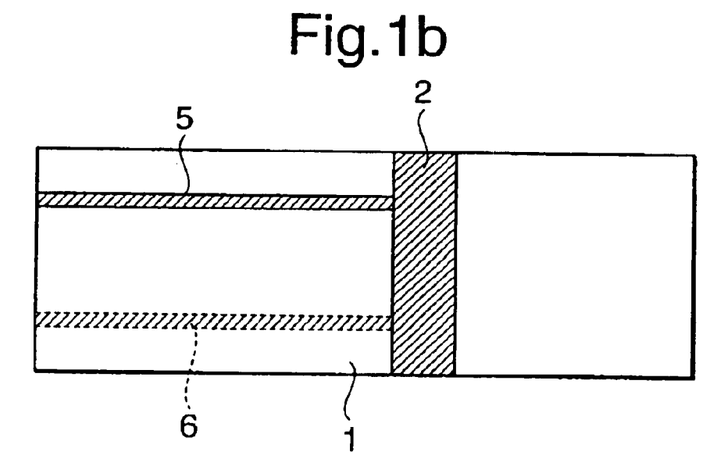

Referring to FIGS. 1a and 1b (FIG. 1a is a side view and FIG. 1b is a plan view) illustrating a representative shape of the piezoelectric resonator of the present invention, the piezoelectric resonator has a wedge shape (i.e., tapered shape) as viewed from the side thereof, and has a piezoelectric substrate 1 of a rectangular shape as viewed from the upper surface thereof and a pair of drive electrodes 2 and 3 formed in an opposing manner on a central portion on both inclined surfaces (tapered surfaces) of the piezoelectric substrate 1. As will be understood from FIG. 1a, the piezoelectric substrate 1 is tapered as a whole. As will be understood from FIG. 1b, further, electrode wires 5 and 6 extending from the drive electrodes 2 and 3 toward the side of the thick portion of the piezoelectric substrate 1 without overlapping one upon the other, and are connected to terminal electrodes (not shown) provided on the side of the thick portion.

The piezoelectric substrate 1 can be formed of a piezoelectric magnetic material or quartz. When importance is given to the temperature characteristics, the piezoelectric substrate 1 is formed of quartz. When importance is given to the band between a resonance peak and an anti-resonance peak, it is desired that the piezoelectric substrate 1 is formed of a single crystal such as of LT (lithium tantalate, $LiTaO_3$) or the like. If the piezoelectric substrate 1 is formed of a sintered material such as piezoelectric ceramics, it becomes possible to fabricate the piezoelectric substrate 1 of a void-free thin-film ceramic material relying upon the thin-film piezoelectric ceramic-forming means, and a resonator equipped with the piezoelectric substrate 1 of a piezoelectric ceramic material can be realized, though defects such as voids become highly likely to impair the resonance characteristics. The drive electrodes 2, 3, electrode wires 5, 6, and terminal electrodes that are not shown, are formed by such means as vacuum evaporation or sputtering of good conductors like Cu, Ni, Au, etc.

In the piezoelectric resonator of the present invention, the frequency can be finely adjusted for compensating dispersion in the thickness by changing the positions for forming the drive electrodes 2 and 3 in a tapered direction (lengthwise direction of the piezoelectric substrate 1) even when there is a dispersion in the thickness of the piezoelectric substrate 1. That is, the thickness of the piezoelectric substrate 1 is gradually decreasing in the tapered direction. Even when there is a dispersion in the thickness of a portion where the drive electrodes 2 and 3 are formed, a desired resonance frequency is obtained if the positions for forming the drive electrodes 2 and 3 (positions in the lengthwise direction) are suitably selected.

In a conventional thickness extensional resonator, the dispersion in the thickness of the piezoelectric substrate is about several microns, and the frequency is adjusted by controlling the thickness of the drive electrodes. In order to precisely control the thickness of the drive electrodes, therefore, vacuum evaporation must be effected many times on the surfaces of the drive electrodes requiring an increased period of time and an increased cost. According to the present invention, however, the average thickness of the piezoelectric substrate 1 can be easily changed over a range of about several microns by changing the positions of the drive electrodes 2 and 3, thereby to easily adjust the frequency.

Further, the piezoelectric substrate 1 has the shape of a wedge of which the thickness gradually changes, and exhibits an increased effect of confining energy in the tapered direction, i.e., in the lengthwise direction.

According to the present invention as described above, there is obtained a piezoelectric resonator that oscillates at a desired resonance frequency without affected by the dispersion in the thickness of the piezoelectric substrate 1. Upon changing the thickness of the drive electrodes 2 and 3 in a manner to compensate the change in the thickness of the wedge-shaped piezoelectric substrate 1, further, energy can be more effectively confined making it possible to suppress ripples due to multiplied oscillation in the lengthwise direction of the piezoelectric substrate 1.

In the piezoelectric oscillator of the present invention, when the length of the wedge-shaped piezoelectric substrate 1 in the horizontal direction is denoted by L, the thickness of the thinnest portion thereof by t1 and the thickness of the thickest portion thereof by t2, it is desired that the conditions of the following formulas (1) and (2) are satisfied:

$$t1/t2 \geq 0.8 \tag{1}$$

$$(t2-t1)/L \leq 2/100 \tag{2}$$

That is, according to the formula (1), the above-mentioned piezoelectric substrate 1 of the wedge shape satisfies the condition, $t2 > t1 \geq 0.8t2$ Even when a piezoelectric substrate 1 of a thickness of several tens of microns is to be fabricated, in general, it is allowed to suppress the dispersion in the thickness of the piezoelectric substrate 1 to be smaller than 10% relying upon the etching technology. When the piezoelectric substrate 1 has the shape of a wedge satisfying the conditions of the above-mentioned formula (1), a desired frequency can be obtained by suitably changing the positions for forming the drive electrodes 2 and 3 on the inclined surfaces of the piezoelectric substrate 1 (between the thinnest portion 1a and the thickest portion 1b) if the dispersion in the thickness is smaller than about 10%. To form the drive electrodes 2 and 3 near the center of the piezoelectric substrate 1, it is desired that the dispersion in the thickness of the piezoelectric substrate 1 is suppressed to be not larger than 5%.

The conditions of the above formula (2) are concerned with the taper of the inclined surfaces of the wedge-shaped piezoelectric substrate 1. Upon selecting the taper $[(t2-t1)/L]$ to be not larger than 2/100, it is allowed to realize the oscillation mode close to the fundamental oscillation that is realized with a flat plate by adjusting the thickness profile of the drive electrodes 2 and 3 without greatly destroying the confinement of energy by the drive electrodes 2 and 3. In particular, the thickness of the drive electrodes 2 and 3 formed by vacuum evaporation is not larger than 1 micron. In order to falsely realize the oscillation conditions close to those of a flat plate by adjusting the thickness profile of the drive electrodes 2 and 3, it is desired that the difference in the substrate thickness between the drive electrodes 2, 3 on the side of the thinnest portion 1a and on the side of the thickest portion 1b, is equal to, or smaller than, the thickness of the drive electrodes 2, 3. In the present invention, the inclined surfaces of the piezoelectric substrate 1 are tapered within the above-mentioned range, so that the above-mentioned difference in the substrate thickness lies within a range in which the oscillation conditions close to those of the flat plate can be obtained.

In the present invention, it is desired that the length L of the piezoelectric substrate 1 is from 0.5 to 1.5 mm from such a standpoint that the dispersion in the thickness due to etching or the like becomes smaller than 5% and that the taper satisfies the conditions of the formula (2). Further, the thickness t1 of the thinnest portion 1a and the thickness t2 of the thickest portion 1b of the piezoelectric substrate 1 are so set that the average thickness of the piezoelectric substrate 1 meets a desired resonance frequency.

Figure 2A:
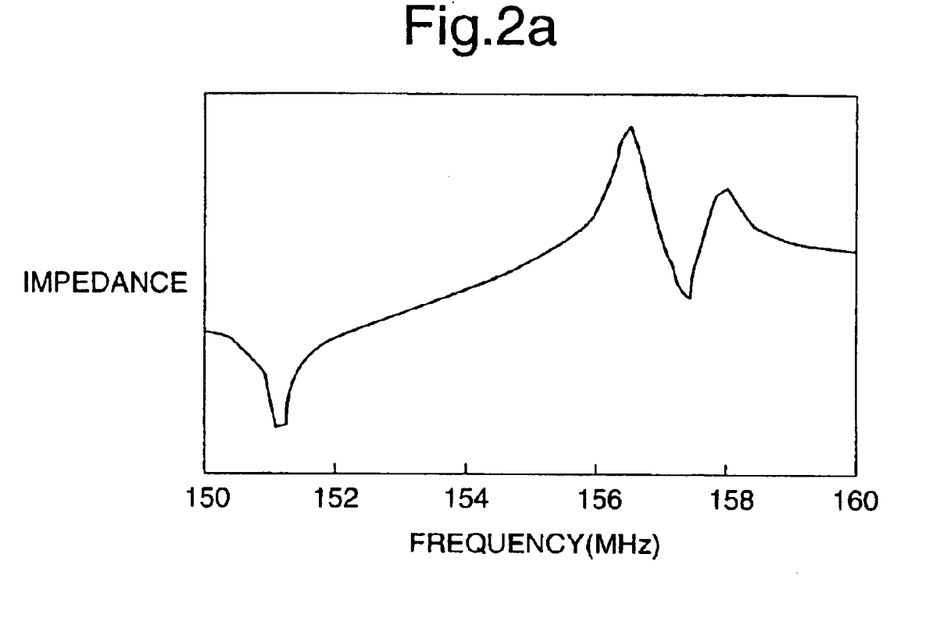
FIG. 2a is a diagram illustrating the simulated results of when the drive electrodes are formed at positions deviated by 50 μm toward the thick side from the center of the tapered portion.
Figure 2B:
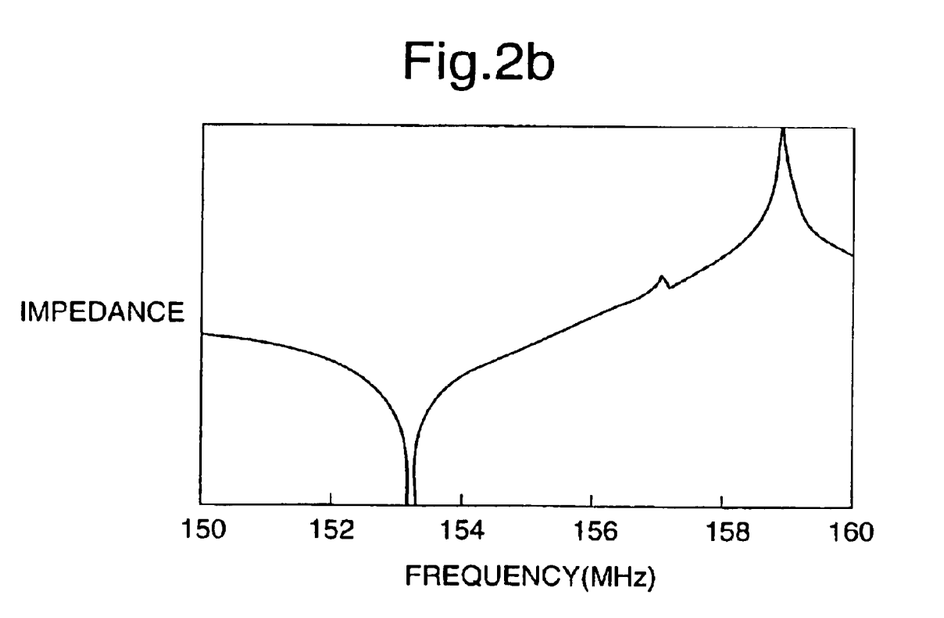
FIG. 2b is a diagram illustrating the simulated results of when the drive electrodes are formed at the central position of the tapered portion of the piezoelectric substrate.

FIGS. 2a and 2b illustrate the results (impedance characteristics) of simulation concerning whether the resonance frequency of the piezoelectric resonator of the present invention shown in FIGS. 1a and 1b can be changed by changing the positions for forming the drive electrodes 2 and 3, and whether the piezoelectric resonator of the invention shown in FIGS. 1a and 1b is utilizable. The piezoelectric substrate 1 that is used satisfies the conditions of L=0.5 mm, t1=8 μm and t2=10 μm, and is formed by using a generally employed piezoelectric ceramic material (PZT material). FIG. 2b illustrates impedance characteristics of when the drive electrodes 2 and 3 are formed at the center in the tapered direction, and FIG. 2a illustrates impedance characteristics of when the drive electrodes 2 and 3 are formed at positions deviated by 50 μm from the center toward the thickest portion 1b.

It will be understood from FIGS. 2a and 2b that the resonance frequency can be changed by changing the positions of the drive electrodes 2 and 3. Besides, from FIG. 2b, it will be understood that favorable impedance characteristics of the resonator are obtained by controlling the ripples. Namely, it will be understood that the piezoelectric substrate 1 having side surfaces of a wedge shape can be effectively used as a piezoelectric resonator.

As described above, the present invention deals with a thickness extensional oscillator of such high frequencies as 100 to 300 MHz by using a fundamental mode, and provides a piezoelectric resonator of a shape which is little affected by the dispersion in the thickness and having a structure which can be easily corrected at the time of forming the drive electrodes even when there is a dispersion in the thickness, making it possible to obtain a high-frequency thickness extensional piezoelectric resonator over a band of 100 to 300 MHz using a more simple and effective fundamental mode.

In the present invention, further, the electrode wires 5 and 6 connected to the drive electrodes 2 and 3 are drawn toward the thickest portion 1b of the piezoelectric substrate 1, and the piezoelectric resonator (piezoelectric substrate 1) is held on the side of the thickest portion of the piezoelectric substrate 1, featuring a structure which is strong against the shocks such as of when it has dropped.

Figure 3:
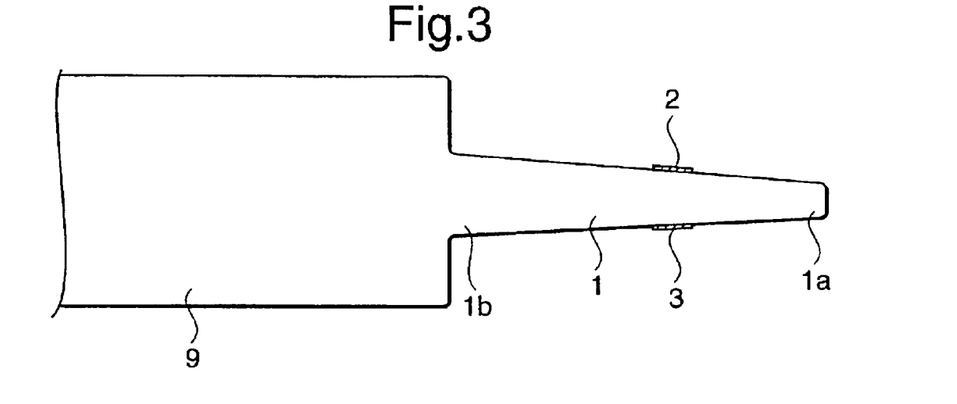
FIG. 3 is side sectional view illustrating the piezoelectric resonator of the present invention by using a piezoelectric substrate having a tapered portion on the side surface of a thick base portion.

In the piezoelectric resonator of FIGS. 1a and 1b, further, the piezoelectric substrate 1 as a whole has a wedge shape and is tapered as a whole. As shown in FIG. 3, however, a tapered portion may be formed on part of the piezoelectric substrate 1 (i.e., part of the piezoelectric substrate 1 may have a wedge shape).

That is, the piezoelectric substrate of the piezoelectric resonator shown in FIG. 3 has a tapered portion which as a whole is designated at 1, the thickest portion 1b of the tapered portion 1 being continuous to a base portion 9 that has a thickness larger than that of the thickest portion 1b. That is, the tapered portion 1 corresponds to the whole piezoelectric substrate 1 shown in FIGS. 1a and 1b. Though not shown in FIG. 3, electrode wires 5 and 6 are extending on the upper and lower surfaces of the base portion 9 along the inclined surfaces from the drive electrodes 2 and 3 formed on the inclined surfaces of the tapered portion 1.

Figure 4:
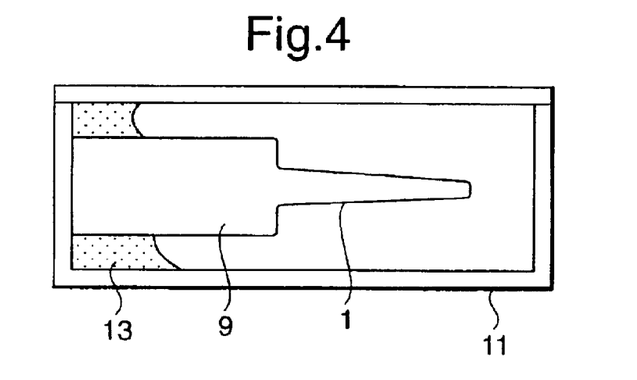
FIG. 4 is a side sectional view illustrating a piezoelectric resonator device containing the piezoelectric resonator of FIG. 3 in a container.

The piezoelectric resonator shown in FIG. 3 can be used, particularly, as a piezoelectric resonator device which is strong against the shocks of when it has dropped. FIG. 4 illustrates the structure of the piezoelectric resonator. Namely, in FIG. 4, the base portion 9 having a large thickness is held and secured in the container 11 by using an adhesive 13 such as Ag paste or electrically conducting adhesive. Therefore, despite the tapered portion 1 has a small average thickness for high-frequency use, the structure is strong against shocks such as of when it has dropped.

Figure 5:
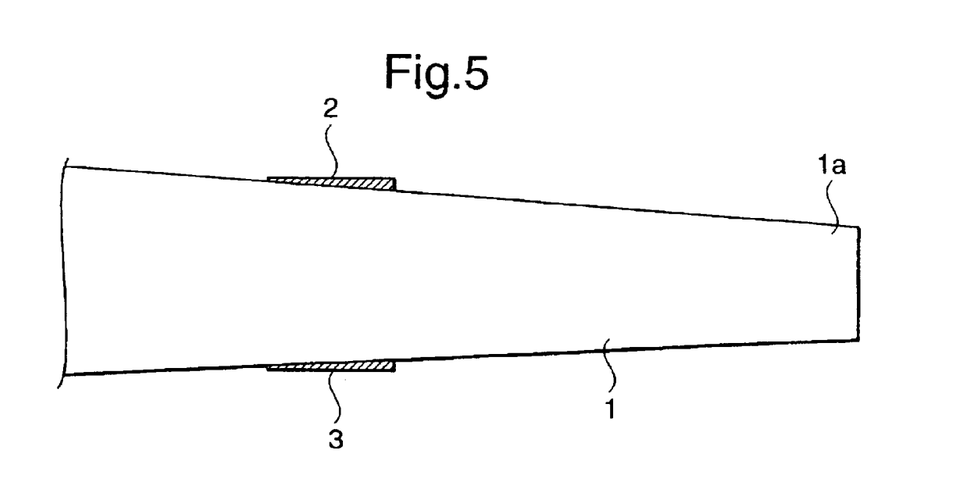
FIG. 5 is a sectional view illustrating an embodiment in which the thickness of the drive electrodes is gradually increased toward an end of the tapered portion.

In the present invention, further, the thickness of the drive electrodes 2 and 3 is so changed as to compensate the taper (inclined surfaces) of the piezoelectric substrate 1, so that the impedance characteristics will not be affected by the ripples. FIG. 5 is a view illustrating, on an enlarged scale, a portion of the side surface of the piezoelectric resonator in which the thickness of the drive electrodes 2 and 3 is adjusted.

That is, in FIG. 5, the drive electrodes 2 and 3 formed on the inclined surfaces of the piezoelectric substrate 1 have a thickness which gradually increases in the tapered direction (toward the thinnest portion 1a), such that the total thickness of the thickness of the piezoelectric substrate 1 and of the thickness of the drive electrodes 2 and 3 remains the same in the lengthwise direction. Concretely, as shown in FIG. 5, the upper surface of the upper drive electrode 2 and the lower surface of the lower drive electrode 3 are both directed in the horizontal direction. Upon adjusting the thickness of the drive electrodes 2 and 3 as described above, the device is so designed that the impedance characteristics will not be affected by the ripples. By controlling the average thickness of the drive electrodes 2 and 3, further, the resonance frequency can be finely adjusted. By increasing the length of the drive electrodes 2 and 3 in the horizontal direction (width in a direction perpendicular to the tapered direction), further, it is allowed to increase the areas of the drive electrodes 2 and 3, and to increase the value of the peak valley which is one of the important items of the impedance characteristics.

The piezoelectric resonators of the present invention are not limited to those of the shapes shown in FIGS. 1 and 3 only but can be changed in a variety of ways, such as forming an inclined surface on one side only of the tapered portion of the piezoelectric substrate 1 and forming a flat surface on the other side thereof, or forming a plurality of tapered portions on the piezoelectric substrate 1.

Figure 6:
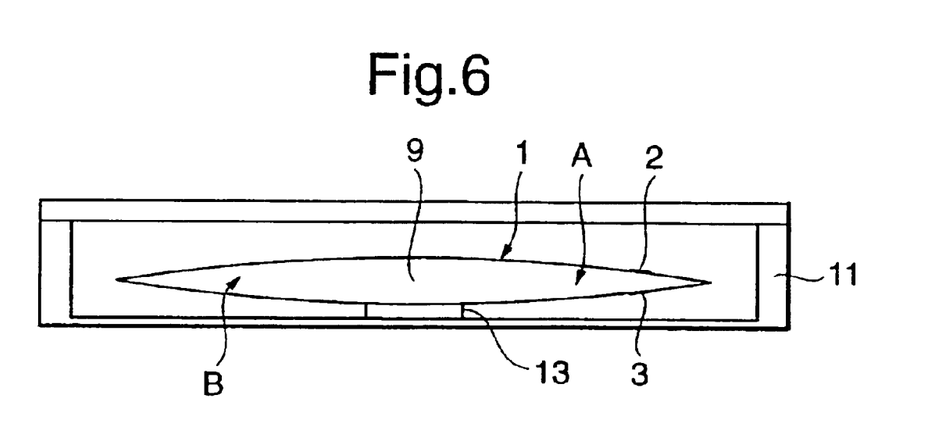
FIG. 6 is a side sectional view schematically illustrating the piezoelectric resonator device in which the piezoelectric resonator of another embodiment of the present invention is held and secured in a container.

Referring, for example, to FIG. 6, tapered portions A and B are formed on both sides of the base portion 9, and the inclined surfaces of the tapered portion A are formed to be continuous to the surfaces of the base portion 9, so that the piezoelectric substrate 1 as a whole assumes the shape of a convex lens. In this case, the drive electrodes 2 and 3 may be formed on the tapered portion A on one side.

The piezoelectric resonator of the embodiment of FIG. 6, too, is held and secured in the container 11 at its base portion 9 by using an adhesive 13 to constitute a structure which is strong against the shocks of when it has dropped. Upon cutting the end portion of the tapered portion A on where the drive electrodes 2 and 3 are formed by mechanical polishing or the like method, the piezoelectric resonator shown in FIG. 6 becomes capable of satisfying the conditions of the formula (1).

When the piezoelectric substrate 1 as a whole is assuming the shape of a convex lens, the piezoelectric resonator can be held and secured in the container 11 at the tapered portion B on the side where the drive electrodes 2 and 3 have not been formed.

Figure 7:
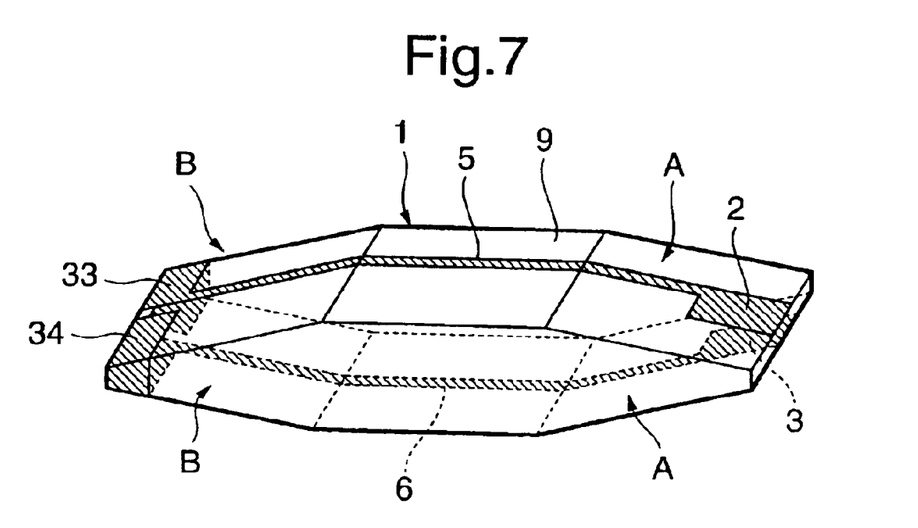
FIG. 7 is a perspective view illustrating the piezoelectric resonator of a further embodiment of the present invention.

In the piezoelectric resonator shown in, for example, FIG. 7, the drive electrodes 2 and 3 are formed on the tapered portion A, and the terminal electrodes 33 and 34 are formed at the ends of the tapered portion B on the opposite side. That is, the electrode lines 5 and 6 are extending from the drive electrodes 2 and 3 along the inclined surfaces of the tapered portion A, surfaces of the base portion 9, and inclined surfaces of the tapered portion B. The terminal electrodes 33 and 34 have been formed over the two inclined surfaces of the tapered portion B. The piezoelectric resonator of FIG. 7 can be used as a piezoelectric resonator device shown in FIG. 8.

Figure 8:
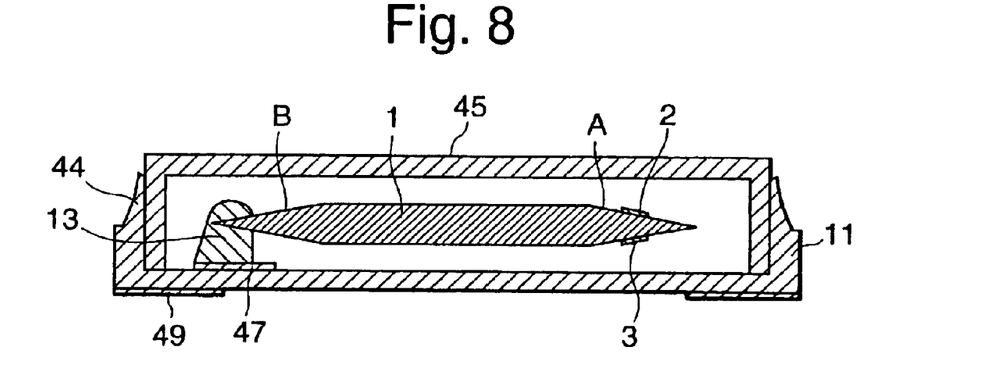
FIG. 8 is a side sectional view of the piezoelectric resonator device in which the piezoelectric resonator of FIG. 7 is held and secured in the container.

That is, in FIG. 8, the piezoelectric resonator is held in the ceramic container 11 by adhering and securing the terminal electrodes 33 and 34 (not shown in FIG. 8) onto electrode pads 47 formed on the upper surfaces of the bottom portions of the container 11 by using an electrically conducting adhesive 13. The electrode pads 47 are electrically connected to external electrodes 49 formed on the lower surface of the bottom portion of the container 11. A metallic closure 45 is provided on the upper surface of the container 11 via an annular seal ring 44 (though the structure for containing the piezoelectric resonator has been drawn in a simplified manner in FIG. 6, the structure is basically the same as that of FIG. 8).

In the piezoelectric resonator of FIG. 8, the piezoelectric resonator is held by being supported at its one end and effectively absorbs the stress that is produced when, for example, the electrically conducting adhesive 13 is cured, making it possible to effectively prevent the oscillation of the piezoelectric substrate 1 from being impaired by the stress.

FIGS. 9 to 12 illustrate further embodiments of the piezoelectric resonator according to the invention.

Figure 9:
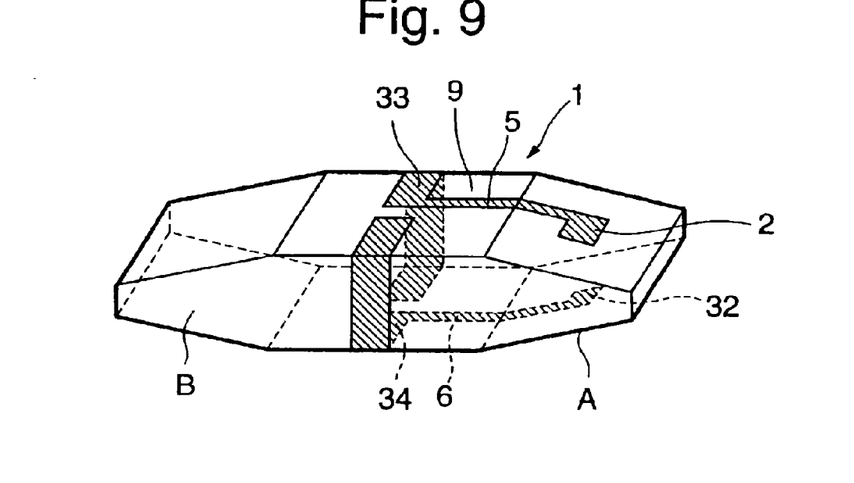
FIGS. 9 to 12 are perspective views illustrating further embodiments of the piezoelectric resonator of the present invention.

In the piezoelectric resonator of FIG. 9, the piezoelectric substrate 1 as a whole has the shape of a convex lens, and has the terminal electrodes 33 and 34 formed at the base portion 9. The terminal electrodes 33 and 34 are extending from the upper surface toward the lower surface of the base portion 9, and are electrically connected, through the electrode wires 5 and 6, to the drive electrodes 2 and 3 formed on the inclined surfaces of the tapered portion A. The piezoelectric resonator of FIG. 9 is held and secured in the container 11 as the thick central portion 9 is supported like that of FIG. 6. The piezoelectric resonator of FIG. 9 makes it possible to decrease the L-component possessed by the electrode wires 5 and 6, and further improves the oscillation characteristics of the piezoelectric resonator device.

Figure 10:
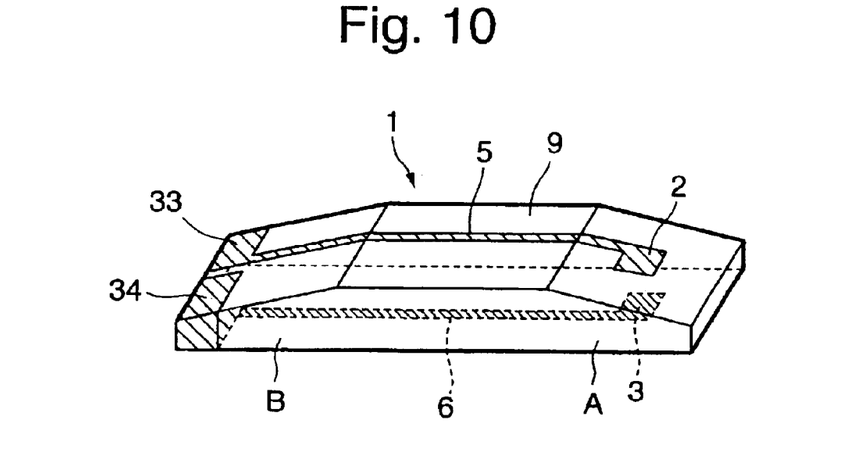

The piezoelectric resonator of FIG. 10 is the same as the piezoelectric resonator of FIG. 7 except that the upper surfaces only are inclined in the tapered portions A and B, and that the piezoelectric resonator as a whole is assuming the shape of a flat convex lens. As shown in FIG. 8, the piezoelectric resonator is held and secured in the container 11 by being supported at its one end.

Figure 11:
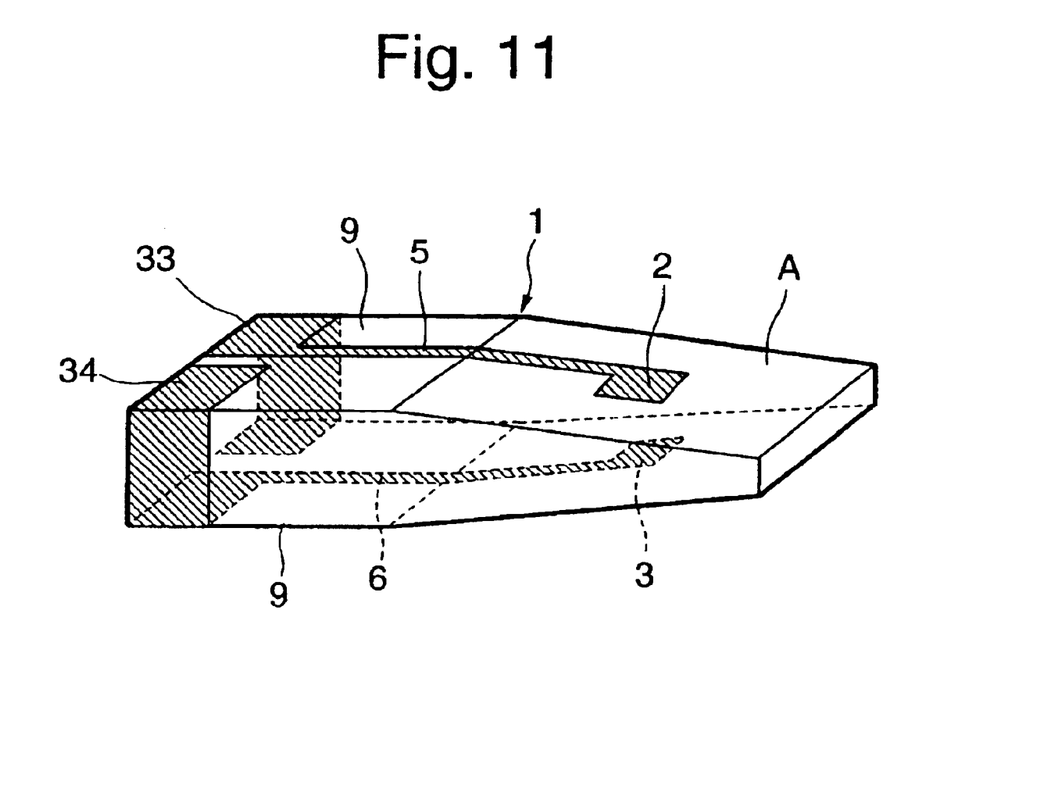

In the piezoelectric resonator of FIG. 11, the tapered portion A is formed on one side of the thick base portion 9 to form the piezoelectric substrate 1, and the terminal electrodes 33 and 34 are formed on the thick base portion 9. That is, like that of the piezoelectric resonator of FIG. 7, the terminal electrodes 33 and 34 are extending from the upper surface to the lower surface of the base portion 9, and are electrically connected, through the electrode wires 5 and 6, to the drive electrodes 2 and 3 formed on the inclined surfaces of the tapered portion A. The piezoelectric resonator is held and secured in the container 11 by being supported at its one end which is the thick base portion 9.

Figure 12:
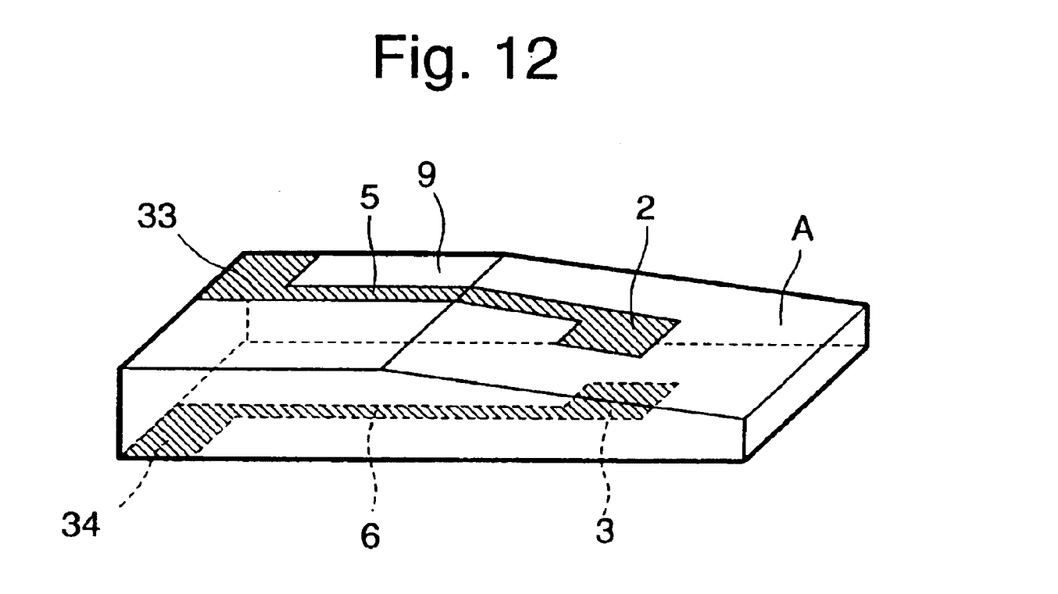

The piezoelectric resonator of FIG. 12 is the same as the piezoelectric resonator of FIG. 11 in regard to that the piezoelectric substrate 1 is formed by forming the tapered portion A on one side of the thick base portion 9. In FIG. 12, however, only the upper surface of the tapered portion A is inclined, and the lower surface of the tapered portion A and the lower surface of the base portion 9 are flat and horizontal surfaces which are continuous to each other. Further, the terminal electrode 33 connected to the drive electrode 2 through the electrode wire 5 is formed on only the upper surface of the thick base portion 9, and the terminal electrode 34 connected to the drive electrode 3 through the electrode wire 6 is formed on only the lower surface of the thick base portion 9. This piezoelectric resonator is held and secured in the container 11 by being held at its one end which is the thick base portion 9.

The piezoelectric resonators shown in FIGS. 11 and 12 are advantageous in regard to that they are compact.

The above-mentioned piezoelectric resonator of the present invention is fabricated by preparing a piezoelectric substrate 1 of a predetermined shape, forming drive electrodes at predetermined positions of the piezoelectric substrate 1 and, as required, finely adjusting the resonance frequency.

When the piezoelectric substrate 1 is to be formed of a piezoelectric ceramic material such as PZT, the powder of the piezoelectric ceramic material is dispersed in a desired solvent to prepare a slurry for molding, an article of a desired shape is molded by using the slurry and is fired to thereby obtain the piezoelectric substrate 1 of a desired shape.

Further, the piezoelectric substrate 1 of quartz is prepared by conducting the mechanical polishing according to a process shown in, for example, FIG. 13.

Figures 13A, 13B:
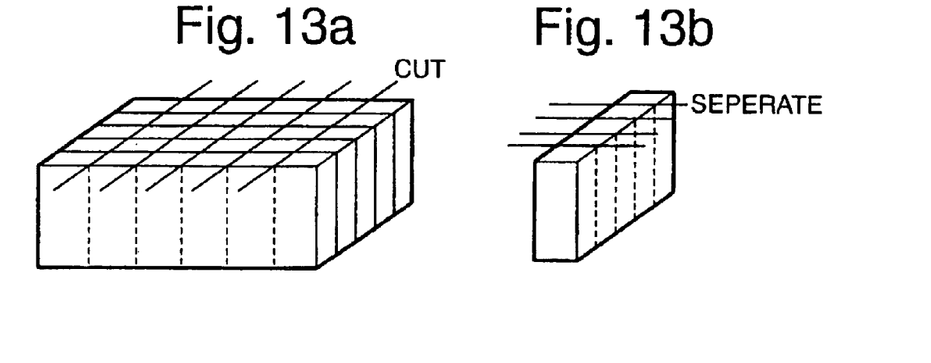
FIG. 13 is a view illustrating a process for producing the piezoelectric substrate used for the piezoelectric resonator of the present invention.
Figure 13C:
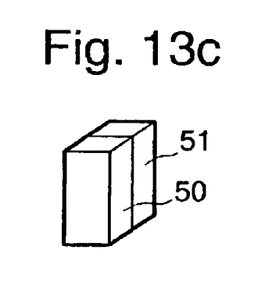

That is, the quartz wafers of a predetermined number of pieces are stuck with their main surfaces being lined with one another by using a paraffin-type thermoplastic adhesive. Then, the quartz wafers which are stuck are cut into a predetermined width at right angles with the main surface (FIG. 13(a)). A bundle of quartz wafers cut as described above is separated into individual wafers by heating at, for example, about 100° C. to obtain quartz substrates 50 of a rectangular parallelopiped shape (shape of a strip of paper) as shown in FIG. 13(c').

Figure 13D:
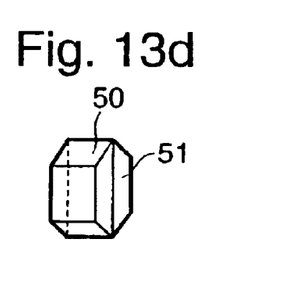
Figure 13E:
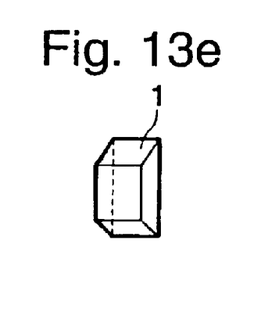
Figure 13F:
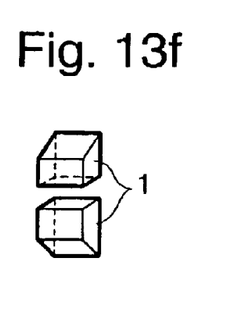

The quartz substrates 50 are bevel-worked or convex-worked to obtain piezoelectric substrates 1 of a desired shape. For example, to prepare the piezoelectric substrate 1 of the type in which both surfaces of the tapered portion are inclined, inclined surfaces are formed on both end portions of the quartz substrate 50 by bevel-working or convex-working to obtain a piezoelectric substrate 1 of a desired shape. In this case, in order to obtain the piezoelectric substrate 1 having the tapered portion on one side only of the base portion, the substrate 1 obtained in FIG. 13(d') may be cut (FIG. 13(e')).

Further, when it is attempted to prepare the piezoelectric substrate 1 of the type in which the one surface of the tapered portion is inclined and the other surface is a horizontal plane, the glass substrate 51 is adhered onto one surface of the quartz substrate 50. Next, the bevel-working or the convex-working is effected in the same manner as described above to prepare a junction of the quartz substrate 50 and the glass substrate 51 having inclined surfaces at predetermined portions (FIG. 13(d)). Then, the glass substrate 51 is removed to obtain the piezoelectric substrate 1 of the desired shape (FIG. 13(e)). To obtain the piezoelectric substrate 1 having the tapered portion on one side only of the base portion, the obtained substrate 1 may be cut (FIG. 13(f)) in the same manner as in FIG. 13(e').

To prepare the piezoelectric substrate 1 of the shape shown in FIG. 3, the thickness of both ends of the quartz substrate 50 shown in FIG. 13(c') is decreased by cutting and, then, the inclined surfaces are formed by bevel-working or convex-working in the same manner as described above.

In the present invention, the bevel-working or the convex-working for forming the inclined surfaces can be conducted relying upon a known pipe method. Namely, the quartz substrate 50 is contained and hermetically sealed in a cylindrical brass or steel container together with a polishing agent or a polish-promoting agent. Then, the cylindrical container is turned to form inclined surfaces at predetermined positions.

Then, the drive electrodes 2, 3, electrode wires 5, 6 and terminal electrodes 33, 34 are formed on predetermined portions of the thus prepared piezoelectric substrate 1 by such means as vacuum evaporation or sputtering via, for example, a mask of a predetermined shape.

The resonance frequency is finely adjusted by trimming the tapered ends or the ends on the opposite side thereof (side of the base portion 9) of the drive electrodes 2 and 3 by, for example, being irradiated with a laser beam or by mechanically polishing the tapered end A simultaneously with mechanically polishing the tapered ends of the drive electrodes 2 and 3. When, for example, the tapered ends of the drive electrodes are removed, the resonance frequency shifts towered the low frequency side. When the portion on the opposite side thereof is removed, the resonance frequency shifts toward the high frequency side. Relying upon this adjustment, it is allowed to obtain a resonance frequency of not lower than 100 MHz. When the piezoelectric substrate 1 of quartz is used, in particular, there is obtained the piezoelectric substrate of a low degree of precision by the bevel-working or convex-working. According to the present invention, however, the drive electrodes are formed in a tapered manner making it possible to easily and reliably adjust the resonance frequency and to easily accomplish a resonance frequency which is as high as 100 MHz or more.

When the piezoelectric substrate of quartz or the like is used, further, the drive electrodes 2 and 3 can be simultaneously trimmed in the same shape since the laser beam transmits through the piezoelectric substrate.

Figure 14:
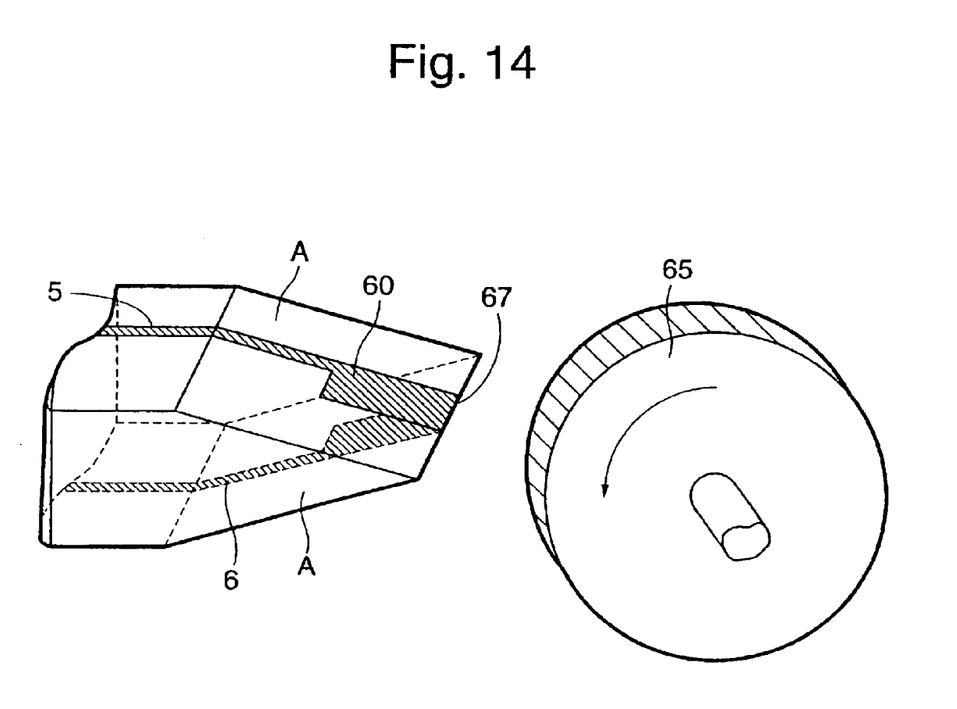
FIG. 14 is a view illustrating how to finely adjust the resonance frequency by the mechanical grinding in producing the piezoelectric resonator of the present invention.

To adjust the resonance frequency by the mechanical polishing as shown, for example, in FIG. 14, a conductor for drive electrodes is integrally formed on both surfaces at the end of the tapered portion A, and the end of the tapered portion A (designated at 67 in FIG. 14) is ground by using a rotary grindstone 65. Relying upon this grinding, the conductor 60 for drive electrodes is separated into a portion positioned on the upper tapered surface and a portion positioned on the lower tapered surface to thereby form the drive electrodes 2 and 3, and, at the same time, to adjust the thickness (t1) at the end of the tapered portion A to lie in a range that satisfies the above-mentioned formula (1). In this case, the drive electrodes 2 and 3 are extending up to the end of the tapered portion A. As required, however, the resonance frequency can be adjusted by removing the ends of the drive electrodes 2 and 3 by trimming relying upon the irradiation with a laser beam. It is, of course, allowable to trim the ends on the opposite side of the drive electrodes 2 and 3 by the irradiation with the laser beam. In the embodiment of FIG. 14, the conductor 60 for drive electrode formed on the upper tapered surface and the conductor 60 for drive electrode formed on the lower tapered surface, are continuous to each other at the end 67. The two conductors 60, however, may be separated from each other at this portion. Further, the drive electrodes 2 and 3 may be formed at positions remote from the end 67, and the mechanical polishing may be effected for the end 67 only of the tapered surface A of the piezoelectric substrate 1.

According to the present invention, it is further possible to finely adjust the resonance frequency by, for example, depositing silver or the like on the surfaces of the drive electrodes 2 and 3 or by thinning the surfaces of the drive electrodes 2 and 3 by the irradiation with argon irons, in addition to the above-mentioned trimming by the laser beam irradiation or by the mechanical polishing.

According to the present invention described above, it is allowed to obtain a piezoelectric resonator which oscillates at a desired resonance frequency without affected by the dispersion in the thickness of the piezoelectric substrate 1.

What is claimed is:

1. A piezoelectric resonator comprising a piezoelectric substrate having a tapered portion as viewed from the side thereof, and drive electrodes formed on opposing surfaces, wherein at least one of said opposing surfaces is tapered, wherein at least one drive electrode is completely formed within an inclined portion of one of said opposing surfaces wherein the thickness of said drive electrodes gradually increases toward the thinnest portion of said tapered portion.

2. A piezoelectric resonator comprising piezoelectric substrate having a tapered portion as viewed from the side thereof, and drive electrodes formed on opposing surfaces where in at least one of said opposing surfaces is tapered, wherein at least one drive electrode is completely formed within an inclined portion, of one of said opposing surfaces wherein electrode wires are connected to said drive electrodes and are extending toward the thickest portion of said tapered portion.

3. A piezoelectric resonator according to claim 2, wherein when the length of said tapered portion in the horizontal direction is denoted by L, the thickness of the thinnest portion of said tapered portion is denoted by t1 and the thickness of the thickest portion of said tapered portion is denoted by t2, aaid tapered portion satisfies the conditions of the following formulas (1) and (2):

$$t1/t2 \geq 0.8 \qquad (1)$$

$$(t2-t1)/L \geq 2/100 \qquad (2)$$

4. A piezoelectric resonator according to claim 2, wherein said piezoelectric substrate is produced by the mechanical polishing and has a resonance frequency of the fundamental waves of not smaller than 100 MHz.

5. A piezoelectric resonator according to claim 2, wherein said piezoelectric substrate is produced by the bevel-working or convex-working.

6. A piezoelectric resonator according to claim 2, wherein said piezoelectric substrate as a whole is forming said tapered port.

7. A piezoelectric resonator device containing a piezoelectric resonator of claim 6 in a container, wherein the thickest portion of the tapered portion of said piezoelectric resonator is held and secured in the container.

8. A piezoelectric resonator comprising a piezoelectric substrate having a tapered portion as viewed from the side thereof, and drive electrodes formed on opposing surfaces, wherein at least one of said opposing surfaces is tapered, wherein at least one drive electrode is completely formed within an inclined portion of one of said opposing surfaces, wherein the drive electrodes at an end of the tapered portion and a root portion of the tapered portion are trimmed by a laser beam.

9. A piezoelectric resonator comprising a piezoelectric substrate having a tapered portion as viewed from the side thereof, and drive electrodes formed on opposing surfaces, wherein at least one of said opposing surfaces is tapered, wherein at least one drive electrode is completely formed within an inclined portion of one of said opposing surfaces, wherein said piezoelectric substrate has a base portion integrally formed with said tapered portion, and said base portion has a thickness not smaller than the thickness of the thickest portion of said tapered portion.

10. A piezoelectric resonator according to claim 9, wherein said tapered portion is formed on both sides of said base portion, said drive electrodes are formed on the tapered surfaces of the tapered portion of one side, and the tapered surfaces of said tapered portion are continuous to the surfaces of said base portion, so that the piezoelectric substrate as a whole has the shape of a convex lens.

11. A piezoelectric resonator device containing a piezoelectric resonator of claim 10 in a container, wherein the end of the tapered portion on where no drive electrode is formed of said piezoelectric resonator is held and secured in the container.

12. A piezoelectric resonator according to claim 9, wherein said tapered portion is formed on only one side of said base portion, and the tapered surfaces of said tapered portion are continuous to the surfaces of said base portion.

13. A piezoelectric resonator device containing a piezoelectric resonator of claim 9 in a container, wherein the base portion of said piezoelectric resonator is held and secured in the container.

14. A method of producing a piezoelectric resonator by forming a piezoelectric substrate having a tapered portion of which the thickness gradually decreases toward an end thereof, forming a conductor for drive electrodes on both opposing tapered surfaces of said tapered portion at an end thereof, and grinding the end of said tapered portion together with the conductor for drive electrodes to form drive electrodes on both tapered surfaces of said tapered portion, wherein the drive electrodes are completely formed within an inclined portion of the opposing tapered surfaces.

15. A method according to claim 14, wherein the conductor for drive electrodes formed on both tapered surfaces at an end of said tapered portion is continuous over the end of said tapered portion, and is cut by said grinding.

16. A method according to claim 14, wherein said piezoelectric substrate is formed by bevel-working or convex-working.

17. A method according to claim 14, wherein the drive electrodes at the end of the tapered portion and the root portion of the tapered portion are trimmed by a laser beam.

* * * * *